(12) United States Patent
Beaman et al.

(10) Patent No.: US 6,380,485 B1
(45) Date of Patent: Apr. 30, 2002

(54) ENHANCED WIRE TERMINATION FOR TWINAX WIRES

(75) Inventors: Brian Samuel Beaman, Apex; Joseph Curtis Diepenbrock, Raleigh, both of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/634,427

(22) Filed: Aug. 8, 2000

(51) Int. Cl.[7] ................................. H01R 9/05
(52) U.S. Cl. ..................... 174/88 R; 439/497; 439/579
(58) Field of Search ................... 174/75 C, 78, 174/88 R, 88 C; 439/579, 497, 610

(56) References Cited

U.S. PATENT DOCUMENTS

| | | | |
|---|---|---|---|
| 4,790,775 A | 12/1988 | David | 439/579 |
| 5,241,135 A | 8/1993 | Fetzer | 174/88 |
| 5,281,762 A | 1/1994 | Long et al. | 174/78 |
| 5,495,075 A | 2/1996 | Jonckheere et al. | 174/74 R |
| 5,509,827 A | 4/1996 | Huppenthal et al. | 439/638 |
| 5,618,202 A * | 4/1997 | Okuyama et al. | 439/497 |
| 5,679,008 A | 10/1997 | Takahashi et al. | 439/76.1 |
| 5,711,686 A | 1/1998 | O'Sullivan et al. | 439/610 |
| 5,768,771 A | 6/1998 | O'Sullivan et al. | 29/828 |
| 5,980,308 A | 11/1999 | Hu et al. | 439/497 |

OTHER PUBLICATIONS

IBM Technical Disclosure Bulletin, vol. 16, No. 6 Nov. 1973, p. 1868.

* cited by examiner

*Primary Examiner*—Chau N. Nguyen
(74) *Attorney, Agent, or Firm*—Bracewell & Patterson, LLP

(57) ABSTRACT

A terminator assembly for a twinax wire. According to this embodiment, a PCB is provided which receives the twinax wire and provides a positive connection between a grounding bar of the PCB and the drain wide of the twinax pair. The drain wire is extended in an orthogonal direction to the twinax pair, and is engaged using an interference fit with the grounding bar. The grounding bar assembly also provides improved shielding for the twinax pair, where the integral shielding of the twinax wire has been removed to provide the connection. In an alternate embodiment, the terminating end of the twinax wire itself is encased in a termination clip. This clip provides shielding for the twinax pair, while electrically connecting with the twinax drain wire. The twinax wire, with the terminating clip, can then be easily attached to a connector PCB adapted to receive the terminator clip.

18 Claims, 10 Drawing Sheets

ENHANCED WIRE TERMINATION FOR TWINAX WIRES

BACKGROUND OF THE INVENTION

1. Technical Field

The present invention generally relates to wire termination techniques for twinax and shielded parallel pair wires used for high performance cables and in particular to methods that provide a low inductance path for the drain wire and shield of the twinax wire.

2. Description of the Related Art

Copper cables for digital communications use many different types of connectors, bulk wire, and wire termination techniques. While copper cables are used in a wide variety of applications, performance requirements for cables continue to increase to keep pace with integrated circuit technology performance increases. In order to meet the performance increases, many copper cables interfaces use low voltage differential signals that require a low skew and low cross-talk connector, bulk wire, and cable assembly construction.

The basic types of bulk wire used in I/O (input/output) cables includes ribbon, twisted pair, coax, twinax, and quad constructions. The preferred bulk wire construction for high speed differential cables is a "twinax" or shielded parallel pair wire. The parallel pair construction is optimized to provide low signal skew performance and the shielding surrounding the wire pair ensure low cross-talk between wire pairs, The shield of the twinax wire is stripped back to expose the insulated signal wires and the drain wire for termination processing. The length of shielding removed from the twinax wire has a significant effect on the shielding performance of the wire.

I/O connectors that are used in copper cables come in many shapes, sizes, and number of contacts. The number of contacts used in the connector is determined by the signal interface requirements. A differential serial interface would typically use a total of 4 signal contacts while a differential parallel interface would typically use a minimum of 36 signal contacts. Many of the current generation of I/O connectors use additional contacts connected to ground to enhance the performance of the connector interface. Ground blades or plates can be used instead of dedicated ground contacts to further enhance the performance of the connector. Most I/O connectors also include a metal shell that provides a connection from the braid shielding in the bulk wire and continuous 360 degree shield around the connector housing to minimize EMI radiation problems.

Typical wire termination techniques for copper cables include bare wire crimping, soldering, welding, and insulation displacement (IDC). Another wire termination technique that is often used for high speed cables includes a small printed circuit card or paddle card attached to the connector with the conductors in the bulk wire soldered to the paddle card. This type of wire termination provides a simple way to incorporate equalization in the cable assembly by adding chip capacitors and resistors to the circuitry on the paddle card.

FIG. 7 shows an isometric view of an I/O cable connector 700 attached to a small printed circuit card 704, in a conventional manner. The I/O cable connector 700 is comprised of an insulating plastic housing 702, a metal shell 703, and multiple conductive contacts 701. The ends of the contacts 701 in the connector 700 are soldered to the corresponding terminal pads 707 on the printed circuit card 704. The printed circuit card 704 also has multiple terminal pads 706 on the top 705 and bottom surfaces for wire terminations.

FIG. 8 shows an isometric view of multiple twinax wires 810 terminated to the printed circuit card 804 attached to the I/O cable connector 800, in a conventional manner. The twinax wires 810 are comprised of two parallel copper signal wires 812, 813 that are covered with insulating dielectric material 814, 815 and surrounded by a thin metallized shield 816. A third bare copper wire 811 or drain wire is located between the two insulated signal conductors 812, 813 and soldered to corresponding terminal pads 806 on the surface 805 of the printed circuit card 804. A portion of the metallized shield 816 is removed to expose the drain wire 811 and the insulation 814, 815 covering each of the signal conductors 812, 813 to allow soldering to the terminal pads 806 on the printed circuit card 804. A portion of the insulation 814,815 covering each of the signal wires 812, 813 is removed to allow soldering to the terminal pads 806 on the printed circuit card 804.

Impedance variations in the cable assembly can cause reflections in a high speed signal interface and result in data errors. Uniform geometry and materials in the bulk wire along with a gradual transition in geometry from the bulk wire to the wire termination and connector interface is essential to minimize impedance variations. Repeatability and consistency of the wire termination process has a similar effect.

Cross-talk from one signal to an adjacent signal or excessive skew between the two conductors of a differential signal can also result in data errors. It would therefore be desirable to provide individually shielded twinax construction, which would minimize cross-talk in the bulk wire and consistent dielectric material properties ensure low signal skew. Further, it would be desirable to provide dedicated ground pins, blades, or plates in the connector along with equal length differential signal wiring and a ground plane paddle card construction to further minimize the effects of cross-talk and skew in the connector and wire termination area.

SUMMARY OF THE INVENTION

It is therefore one object of the present invention to provide a technique for terminating multiple twinax wires with individual shields and drain wires.

It is another object of the present invention to provide a technique for minimizing the impedance discontinuity of the wire terminations.

It is yet another object of the present invention to provide a technique for minimizing the cross-talk in the wire termination area.

It is yet another object of the present invention to provide a low inductance connection from the drain wires on the individually shielded twinax wires to the ground connections in the cable connector.

It is yet an additional object of the present invention to provide a technique for terminating the twinax signal conductors directly to the terminals on the cable connector for applications that do not require equalization circuitry in the cable assembly.

The foregoing objects are achieved as is now described. The preferred embodiment provides a terminator assembly for a twinax wire. According to this embodiment, a PCB is provided which receives the twinax wire and provides a positive connection between a grounding bar of the PCB and the drain wide of the twinax pair. The drain wire is extended in an orthogonal direction to the twinax pair, and is engaged using an interference fit with the grounding bar. The grounding bar assembly also provides improved shielding for the twinax pair, where the integral shielding of the twinax wire has been removed to provide the connection. In an alternate embodiment, the terminating end of the twinax wire itself is encased in a termination clip. This clip provides shielding for the twinax pair, while electrically connecting with the twinax drain wire. The twinax wire, with the terminating clip, can then be easily attached to a connector PCB adapted to receive the terminator clip.

The above as well as additional objectives, features, and advantages of the present invention will become apparent in the following detailed written description.

DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
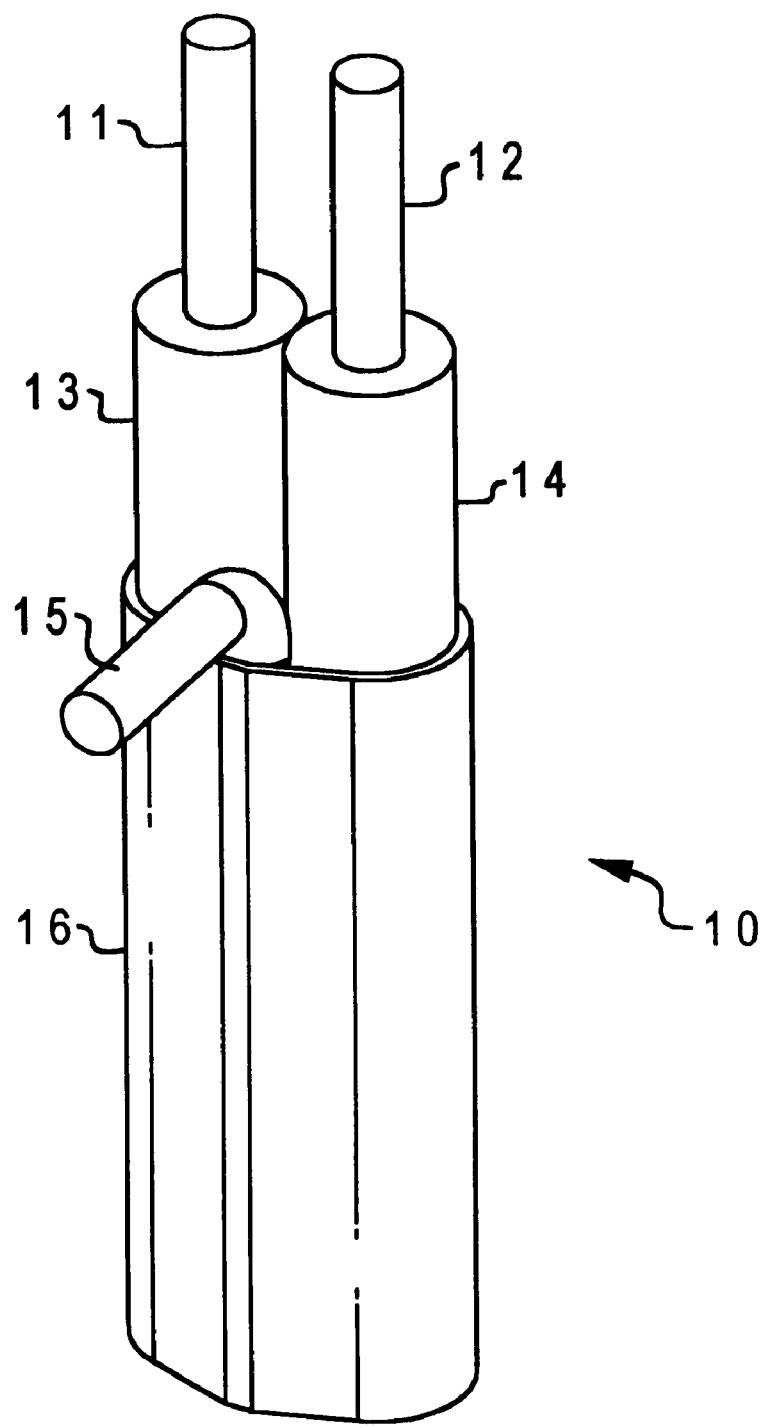
FIG. 1 shows an isometric view of a twinax wire.
Figure 8:
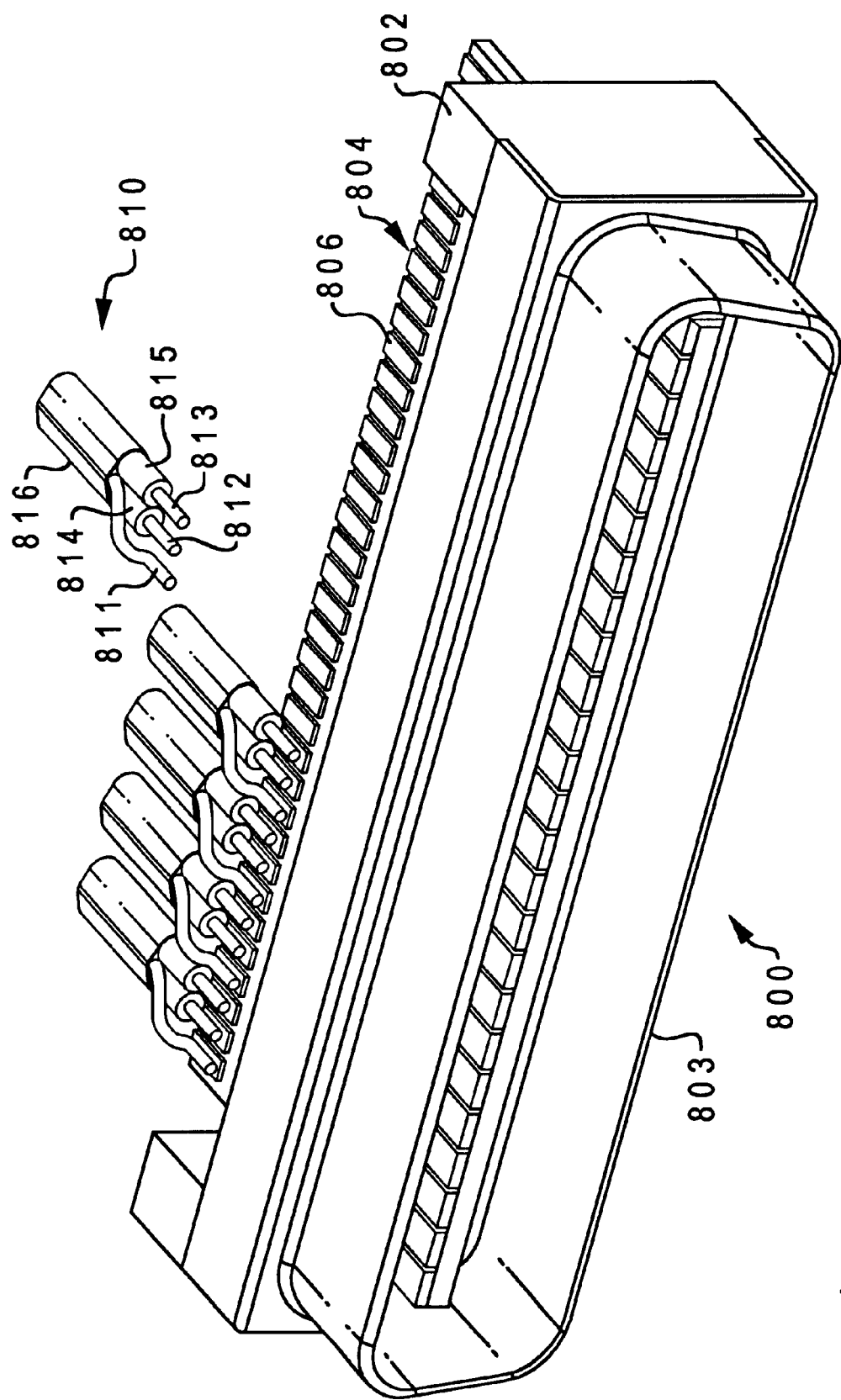
FIG. 8 shows an isometric view of multiple twinax wires terminated to the printed circuit card attached to the I/O cable connector.

With reference now to the figures, and in particular with reference to FIG. 1, an isometric view of a twinax wire 10 is shown. The twinax wire 10 in FIG. 1 is similar to the twinax wire 810 shown in FIG. 8 and is comprised of two parallel copper signal wires 11, 12 that are covered with insulating dielectric material 13, 14 and surrounded by a thin metallized shield 16. A third bare copper wire 15 or drain wire is located between the two insulated signal conductors 11, 12 and is used to make contact with the conductive surface of the thin metallized shield 16. A portion of the metallized shield 16 is removed to expose the drain wire 15 and the insulation 13, 14 covering the two signal wires 11, 12. The drain wire 15 is formed at right angle to the axis of the signal wires 11, 12. The portion of the insulation 13, 14 covering each of the signal wires 11, 12 is removed in preparation of termination.

Figure 2:
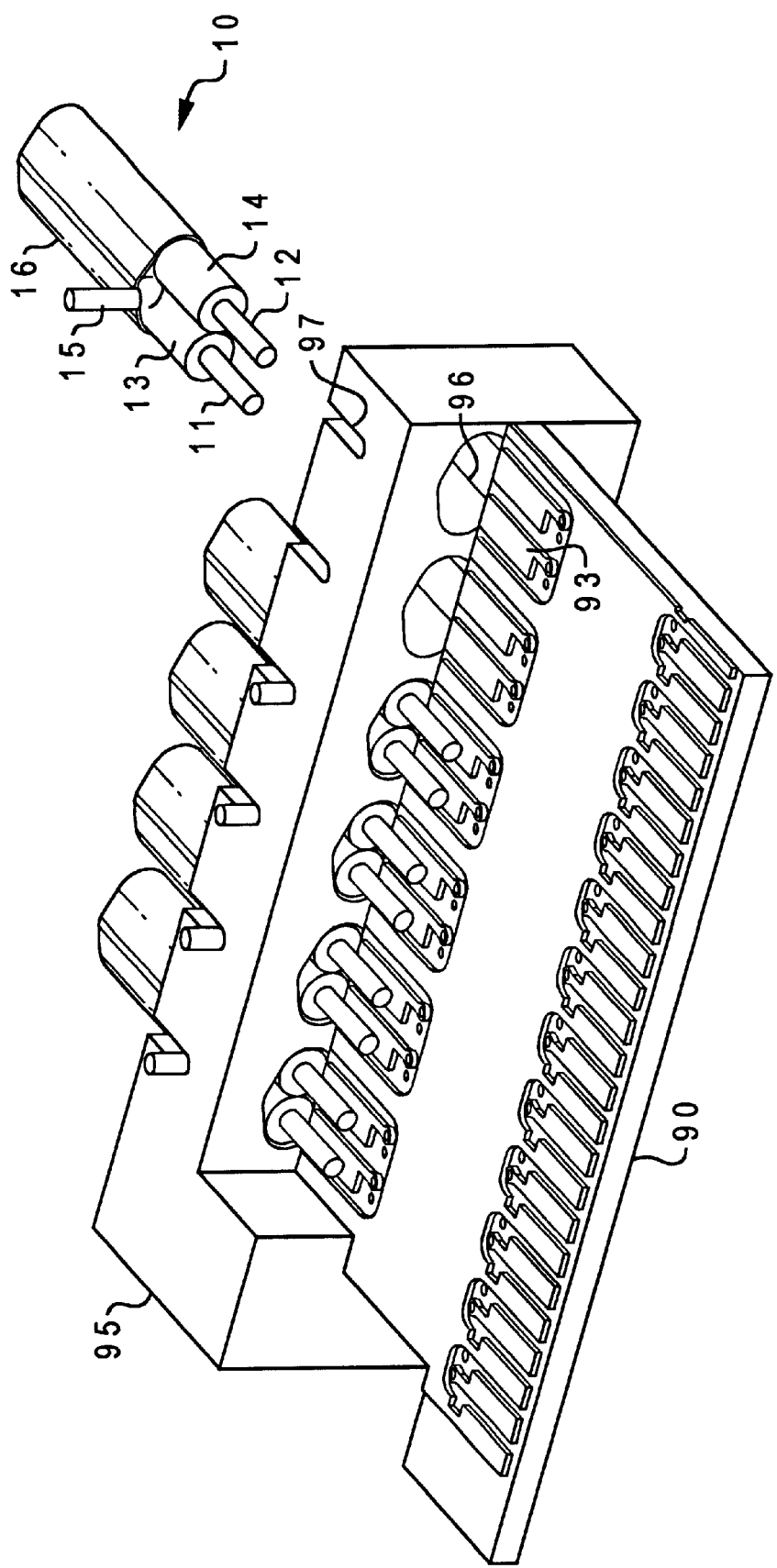
FIG. 2 shows an isometric view of a first embodiment of multiple twinax wires terminated to a small printed circuit card.

FIG. 2 shows an isometric view of a first embodiment of the present invention, wherein multiple twinax wires 10 are terminated to a small printed circuit card 90. A grounding bar 95 with multiple apertures 96 and slots 97 is used to align the twinax wires 10 to the terminal pads 93 on printed circuit card 90 and provide a low inductance connection to the drain wires 15 for each of the twinax wires 10. The size and shape of the apertures 96 in the grounding bar 95 corresponds to the size and shape of the twinax wires 10. The location of the apertures 96 in the grounding bar 95 correspond to the location of the terminal pads 95 on the printed circuit card 90. The slots 97 in the grounding bar 95 are sized to provide an interference fit with the drain wires 15 in the twinax wires 10. The apertures 96 in the grounding bar 95 also provide additional shielding for the twinax wires 10 where the thin metallized shield 16 has been removed.

Figure 3:
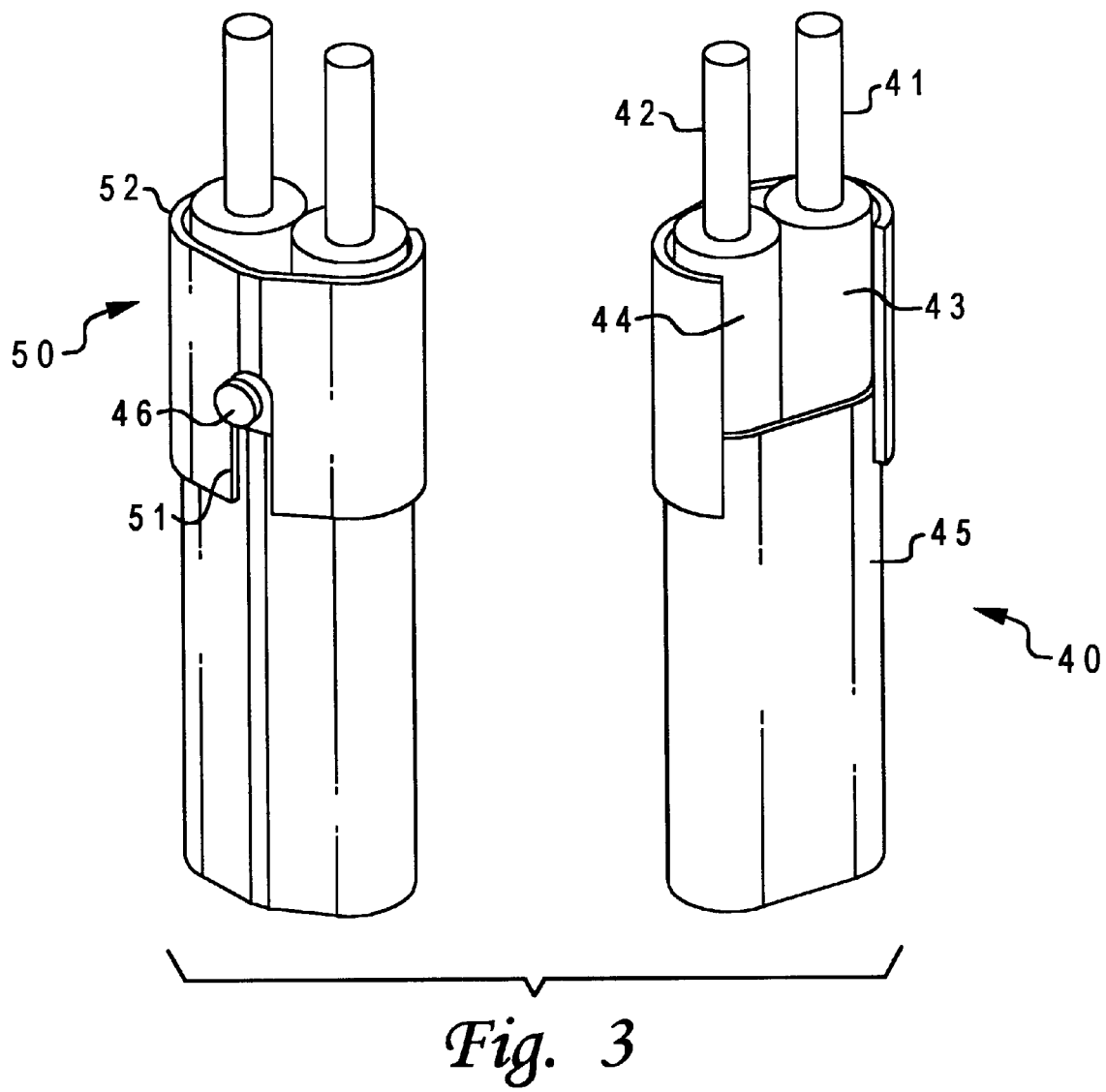
FIG. 3 shows an isometric view of a twinax wire with a first embodiment of a terminated clip attached to the drain wire.

FIG. 3 shows an isometric view of a twinax wire 40 with a first embodiment of a termination clip 50 attached to the drain wire 46. The twinax wire 40 in FIG. 3 is similar to the twinax wire 10 shown in FIG. 1 and is comprised of two parallel copper signal wires 41, 42 that are covered with insulating dielectric material 43, 44 and surrounded by a thin metallized shield 45. A third bare copper wire 46 or drain wire is located between the two insulated signal conductors 41, 42 and is used to make contact with the conductive surface of the thin metallized shield 45. A portion of the metallized shield 45 is removed to expose the drain wire 46 and the insulation 43, 44 covering the two signal wires 41, 42. The drain wire 46 is formed at the right angle to the axis of the signal wires 41, 42. A portion of the insulation 43, 44 covering each of the signal wires 41, 42 is removed in preparation for termination. A metal termination clip 50 is attached to the twinax wire 40. The size and shape of the metal clip 50 corresponds to the size and shape of the twinax wire 40. The slot 51 in the metal clip 50 corresponds to the size and shape of the drain wire 46. The slot 51 in the metal clip 50 is connected to the drain wire 46 in the twinax wire 40 using an interference fit. The right angle portion of the drain wire 46 is trimmed to be almost flush with the other surface 52 of the metal clip 50.

Figure 4:
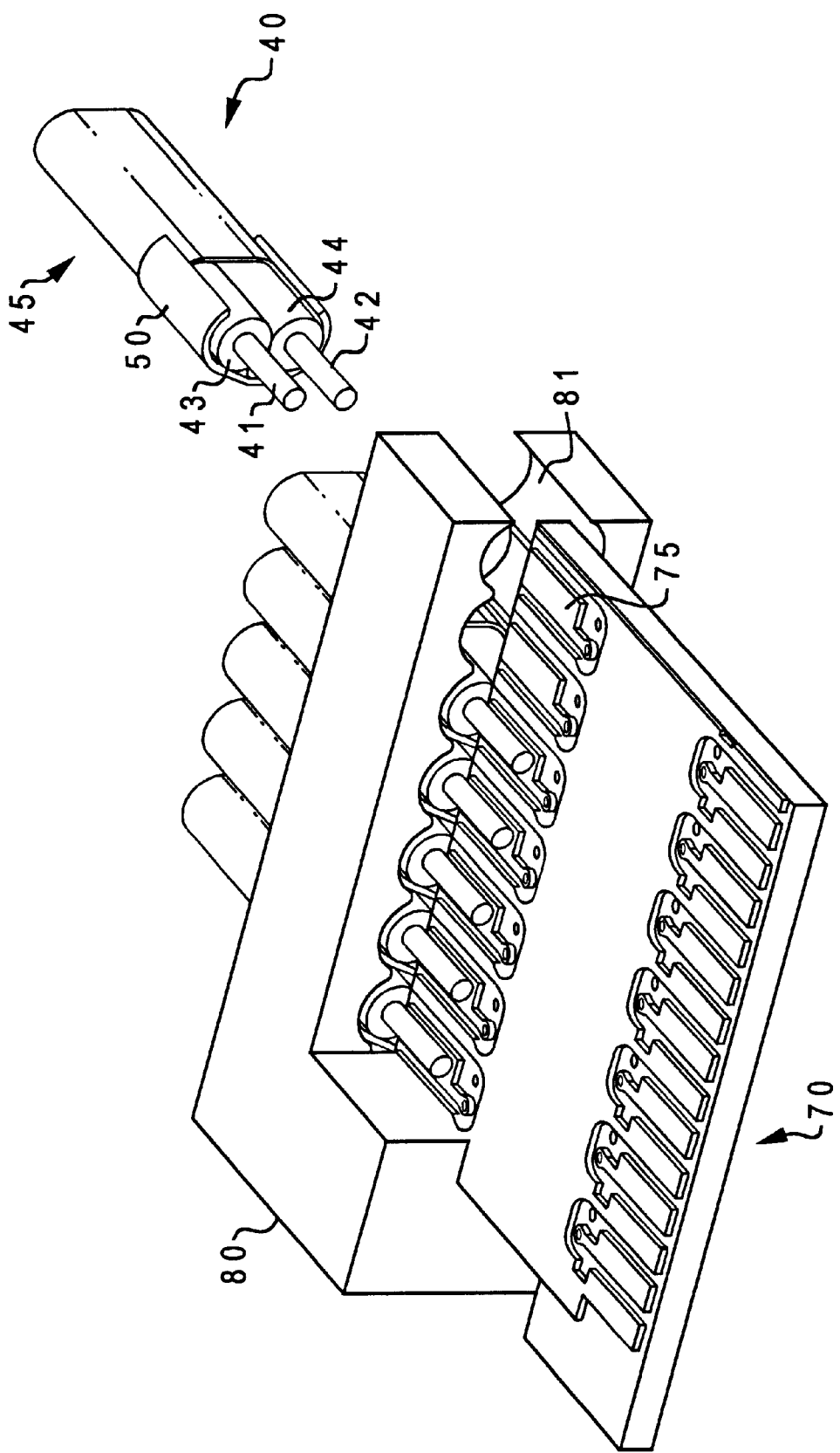
FIG. 4 shows an isometric view of a second embodiment of multiple twinax wires terminated to a small printed circuit card.

FIG. 4 shows an isometric view of a second embodiment of the present invention, wherein multiple twinax wires 40 are terminated to a small printed circuit card 70. A grounding bar 80 with multiple apertures 81 is used to align the twinax wires 40 to the terminal pads 75 on printed circuit card 70 and provide a low inductance connection to the drain wire 46 for each of the twinax wires 40. The size and shape of the apertures 81 in the grounding bar 80 corresponds to the size and shape of the metal ground clip 50 attached to each of the twinax wires 40. The location of the apertures 81 in the grounding bar 80 correspond to the location of the terminal pads 75 on the printed circuit card 70. The metal termination clips 50 attached to each of the twinax wires 40 provide a low inductance connection between the drain wires 46 and the grounding bar 80. The apertures 81 in the grounding bar 80 also provide addition shielding for the twinax wires 40 where the thin metallized shield 45 has been removed.

Figure 5:
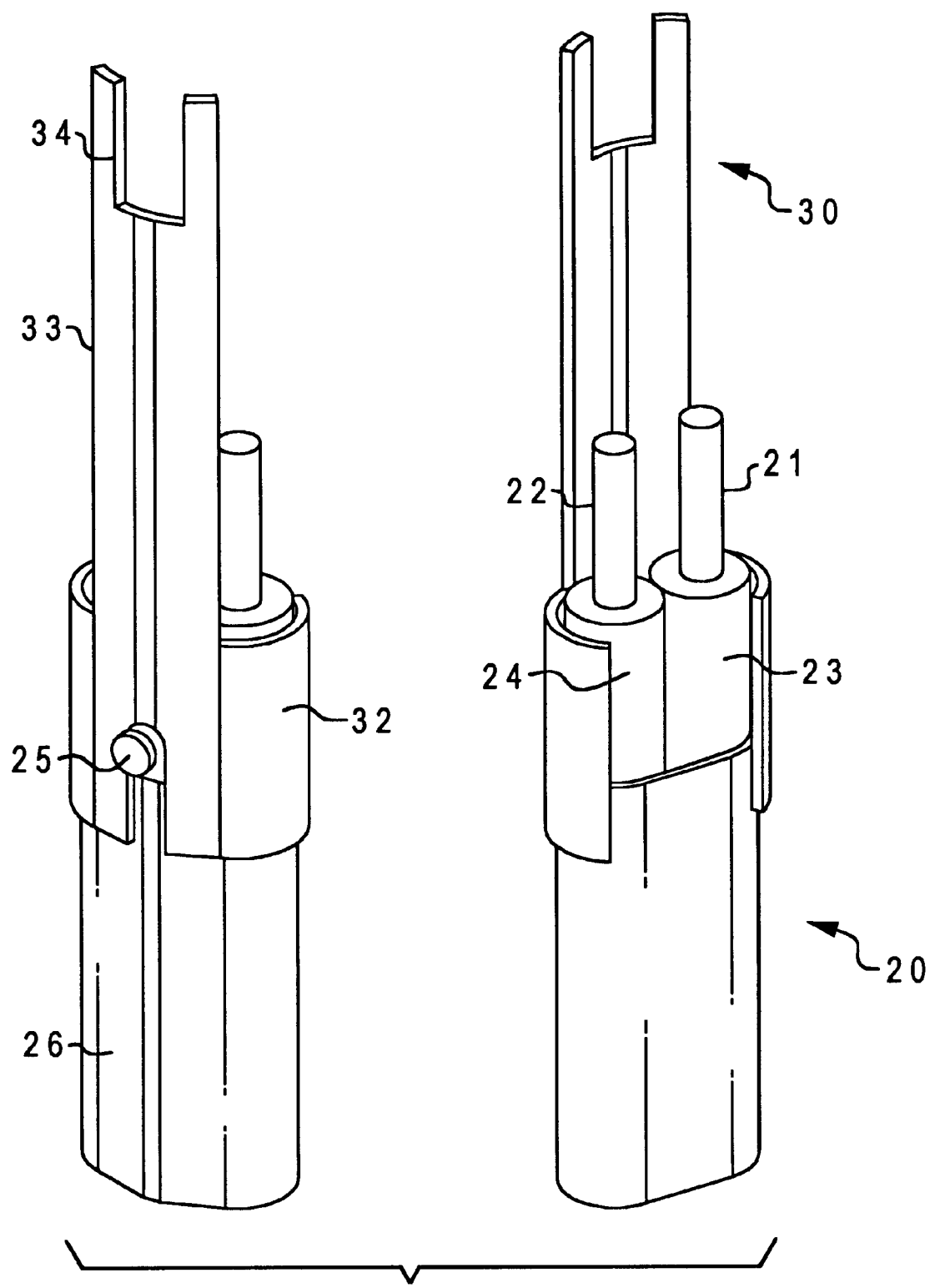
FIG. 5 shows an isometric view of a twinax wire with a second embodiment of a termination clip attached tot he drain wire.

FIG. 5 shows an isometric view of a twinax wire 20 according to a third embodiment of the present invention, wherein a termination clip 30 is attached to the drain wire 25. The twinax wire 20 in FIG. 5 is similar to the twinax wire 40 shown in FIG. 3 and is comprised of two parallel copper signal wires 21, 21 that are covered with insulating dielectric material 23, 24 and surrounded by a thin metallized shield 26. A third bare copper wire 25 or drain wire is located between the two insulated signal conductors 21, 22 and is used to make contact with the conductive surface of the thin metallized shield 26. A portion of the metallized shield 26 is removed to expose the drain wire 25 and the insulation 23, 24 covering the two signal wires 21, 22. The drain wire 25 is formed at right angle to the axis of the signal wires 21, 22. A portion of the insulation 23, 24 covering each of the signal wires 21, 22 is removed in preparation for termination. A metal termination clip 30 is attached to the twinax wire 20 using an interference fit. The right angle portion of the drain wire 25 is trimmed to be almost flush with the outer surface 32 of the metal clip 30. An elongated portion 33 of the termination clip 30 extends beyond the end of the signal wires 21, 22 and has a slotted end 34.

Figure 6:
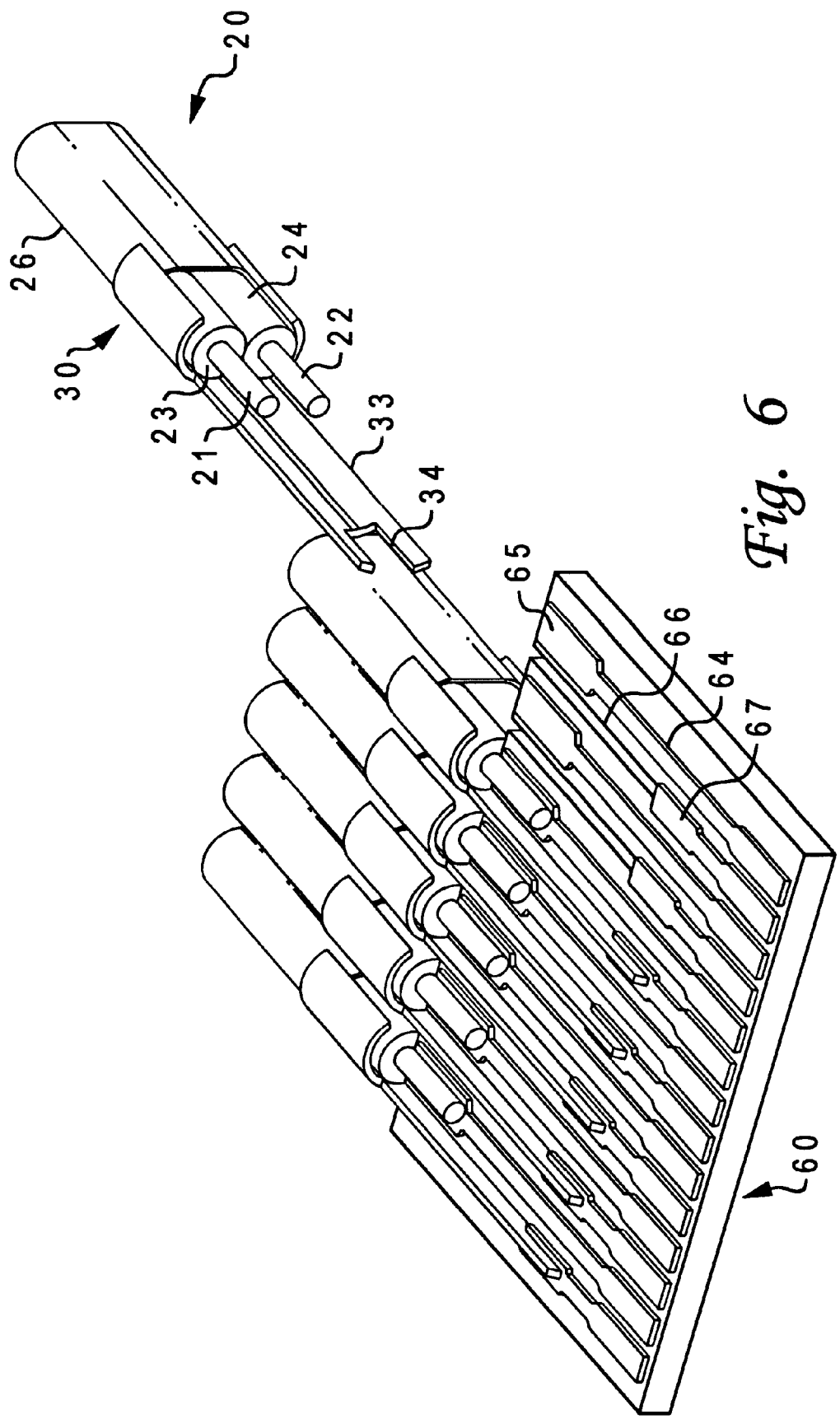
FIG. 6 shows an isometric view of a third embodiment of multiple twinax wires terminated to a small printed circuit card.
Figure 7:
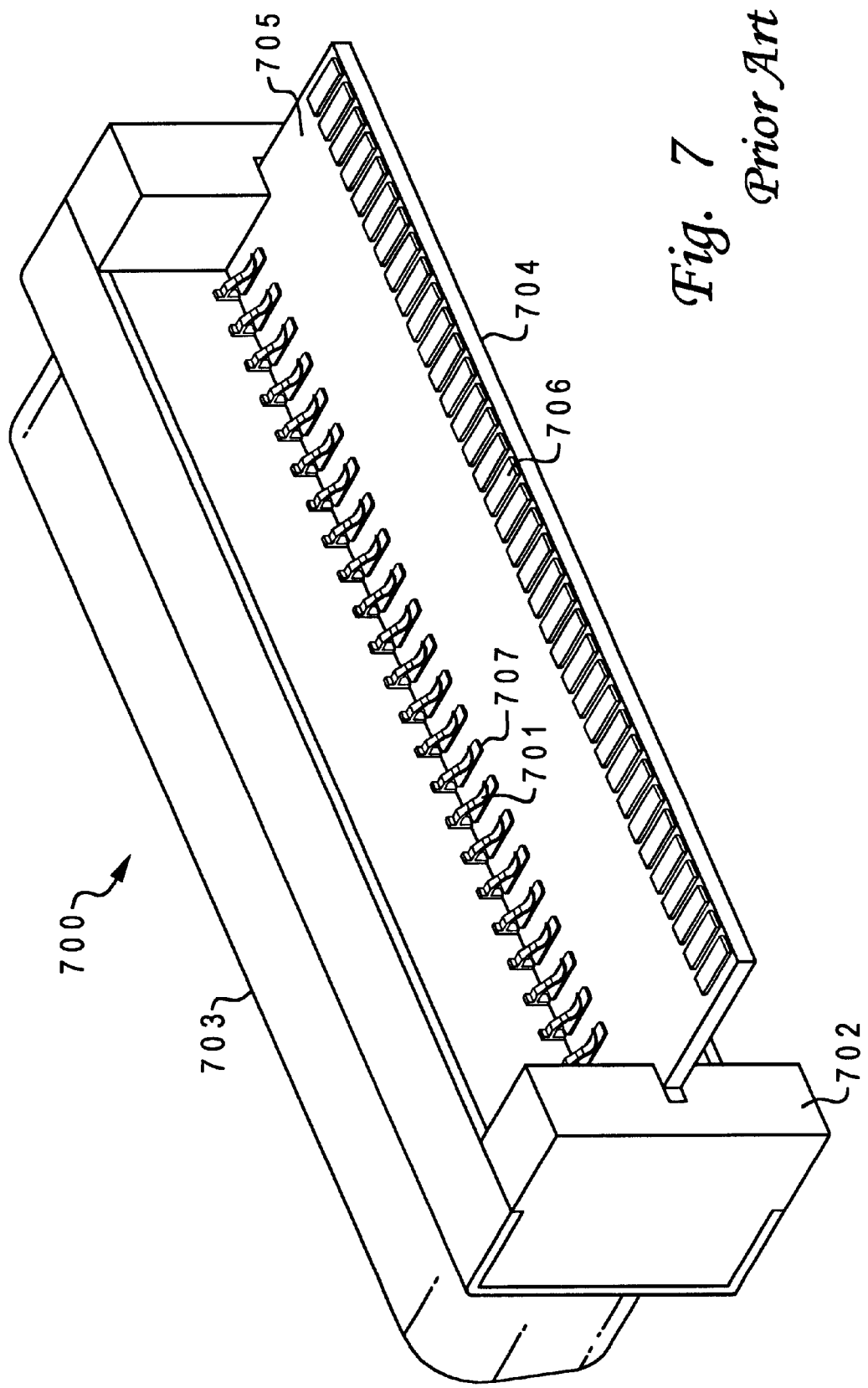
FIG. 7 shows an isometric view of an I/O cable connector attached to a small printed circuit card.

FIG. 6 shows an isometric view of a third embodiment of multiple twinax wires 20 terminated to a small printed circuit card 60. Multiple slots 66 in the printed circuit card 60 are used to align the twinax wires 20 to the terminal pads 65 on printed circuit card 60 corresponds to the length of the elongated portion 33 of the metal termination clip 30 attached to each of the twinax wires 20. The slots 66 in the printed circuit card 60 are located between the terminal pads 65. The metal termination clips 30 attached to each of the twinax wires 20 provide a low inductance connection between the drain wires 25 and the grounding pads 67 on the printed circuit card 60. The metal termination clip 30 also provide addition shielding between the twinax wires 20 and the circuitry lines 64 on the printed circuit card 60.

Figure 9:
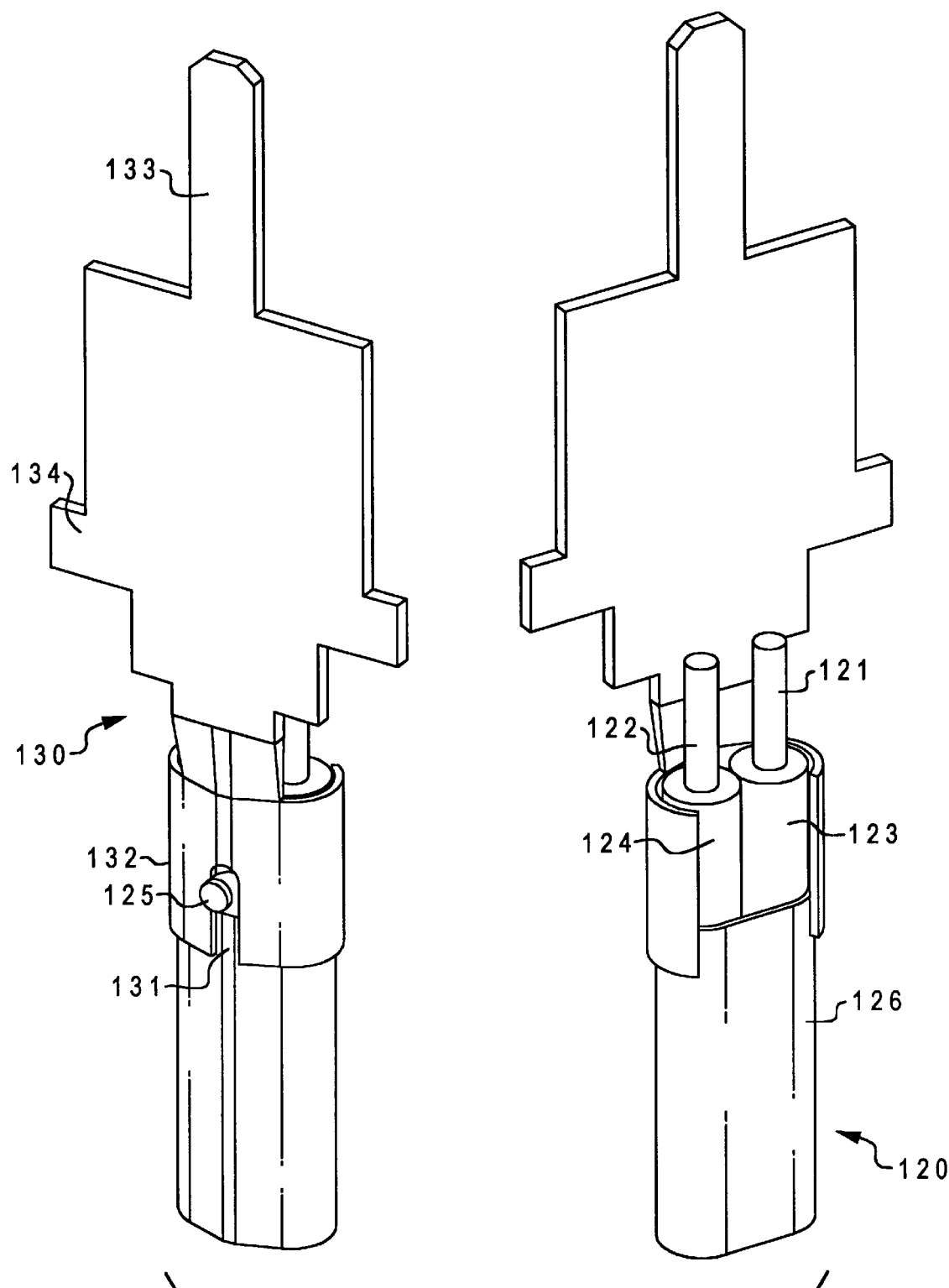
FIG. 9 shows an isometric view of a twinax wire with an third embodiment of a termination clip attached to the drain wire.

FIG. 9 shows an isometric view of a twinax wire 120 with an third embodiment of a termination clip 130 attached to the drain wire 125. The twinax wire 120 in FIG. 9 is similar to the twinax wire 40 shown in FIG. 5 and is comprised of two parallel copper signal wires 121, 122 that are covered with insulating dielectric material 123, 124 and surrounded by a thin metallized shield 126. A third bare copper wire 125 or drain wire is located between the two insulated signal conductors 121, 122 and is used to make contact with the conductive surface of the thin metallized shield 126. A portion of the metallized shield 126 is removed to expose the drain wire 125 and the insulation 123, 124 covering the two signal wires 121, 122. The drain wire 125 is formed at right angle to the axis of the signal wires 121, 122. A portion of the insulation 123, 124 covering each of the signal wires 121, 122 is removed in preparation for termination. A metal termination clip 130 is attached to the twinax wire 120. The size and shape of the curved portion of the metal clip 132 corresponds to the size and shape of the twinax wire 120. The narrow slot 131 in the base of the metal clip 130 is connected to the drain wire 125 in the twinax wire 120 using an interference fit. The right angle portion of the drain wire 125 is trimmed to be almost flush with the outer surface of the metal clip 130. The geometry of the opposite end 133 of the termination clip is designed to match the multiple cavities 154 in the I/O connector housing 152 shown in FIG. 10.

Figure 10:
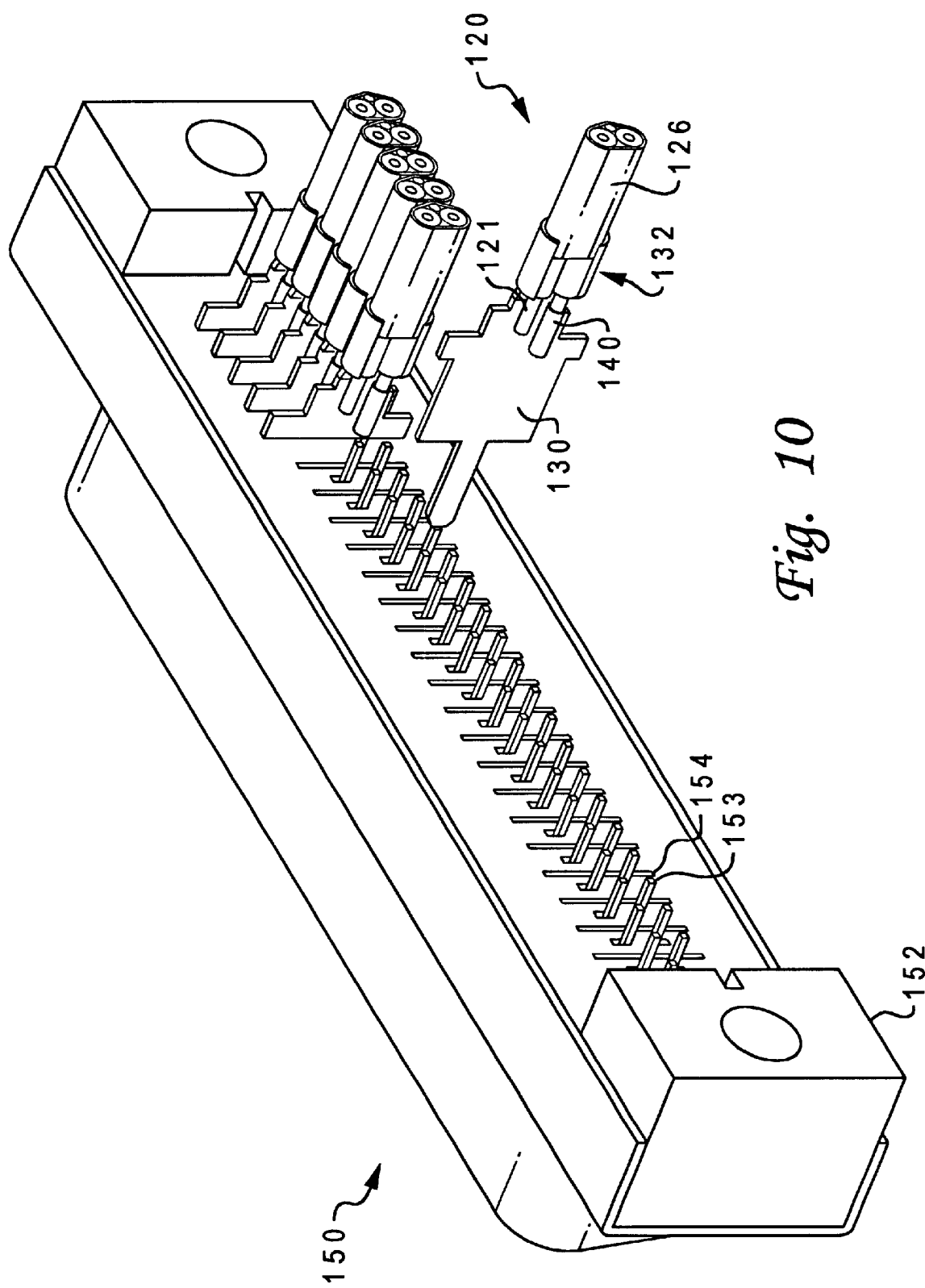
FIG. 10 shows an isometric view of a first embodiment of direct termination of multiple twinax wires to the I/O connector contacts.

FIG. 10 shows an isometric view of a first embodiment of a direct termination of multiple twinax wires 120 to the I/O connector contacts 153. A thin metal tube 140 is attached to each of the signal wires 121, 122 on each of the multiple twinax wires 120. The thin metal tube 140 is attached to the ends of the signal wires 121, 122 by mechanical crimping techniques. The metal tube 140 is positioned with the ends of the signal wires 121, 122 inserted half way through the length of the tube 140. The open half of the metal tube 140 is filled with a solder paste material. The multiple twinax wires 120 with the metal termination clips 130 and metal tubes 140 attached are assembled to the I/O connector 150 by aligning the metal tubes 140 with the ends of the contacts 153 in the connector 150 and inserting the termination clips 130 into the multiple cavities 154 in the connector housing 152. Additional features 134 on the termination clip 130 are used to locate and retain the clips 130 in the connector housing 152. Localized heating and reflowing of the solder paste in the ends of the metal tubes 140 provides a direct connection between the signal wires 121, 122 in the twinax wires 120 and the signal contacts 153 in the I/O connector 150. The blade shaped end 133 of the termination clip 130 provides a means of directly connecting the drain wire 125 and shield 126 on the twinax wires 120 to the ground contacts on the mating I/O connector.

While the invention has been particularly shown and described with reference to a preferred embodiment, it will be understood by those skilled in the art that various changes in form and detail may be made therein without departing from the spirit and scope of the invention.

What is claimed is:

1. A wire-termination assembly, comprising
   a wire member having first and second signal connections, a drain connection, and a shielding member which encases the first signal connection, the second signal connection, and the drain connection, the drain connection extending in an orthogonal direction from the wire member;
   a connector member having an input end and an output end, the input end having electrical receptors for receiving the first signal connection and the second signal connection, the connector member having a grounding bar for electrically shielding the first and second signal connections, the grounding bar electrically connecting to the drain connection;
   wherein when the wire member is inserted in the connector member, signals passing over the wire member are communicated from the input end of the connector member to the output end of the connector member.

2. The assembly of claim 1, wherein the wire member is a shielded parallel-pair wire.

3. The assembly of claim 1, wherein the wire member is a twinax wire.

4. The assembly of claim 1, wherein the connector member is capable of receiving multiple said wire members.

5. The assembly of claim 1, wherein the output end of the connector member is a printed circuit card.

6. The assembly of claim 1, wherein the first signal connection, the second signal connection, and the drain connection are all electrically isolated from each other.

7. A wire-termination assembly, comprising
   a wire member having, at a connection end, first and second signal connections, a drain connection, and a shielding member which encases the first signal connection, the second signal connection, and the drain connection, the drain connection extending in an orthogonal direction from the wire member;
   a clip member encasing the connection end of the wire member, the clip member electrically shielding the first and second signal connections, the clip member electrically connecting to the drain connection;
   a connector member having an input end and an output end, the input end having electrical receptors for receiving the first signal connection and the second signal connection, the connector member having a grounding bar for electrically shielding the first and second signal connections, the grounding bar electrically connecting to the clip member;

wherein when the wire member is inserted in the connector member, signals passing over the wire member are communicated from the input end of the connector member to the output end of the connector member.

8. The assembly of claim 7, wherein the wire member is a shielded parallel-pair wire.

9. The assembly of claim 7, wherein the wire member is a twinax wire.

10. The assembly of claim 7, wherein the connector member is capable of receiving multiple wire members.

11. The assembly of claim 7, wherein the output end of the connector member is a printed circuit card.

12. The assembly of claim 7, wherein the first signal connection, the second signal connection, and the drain connection are all electrically isolated from each other.

13. A wire-termination assembly, comprising a wire member having, at a connection end, first and second signal connections, a drain connection, and a shielding member which encases the first signal connection, the second signal connection, and the drain connection, the drain connection extending in an orthogonal direction from the wire member;

a guide member encasing the connection end of the wire member, the guide member electrically shielding the first and second signal connections, the guide member electrically connecting to the drain connection;

a connector member having an input end and an output end, the input end having electrical receptors for receiving the first signal connection and the second signal connection, the connector member having a grounding bar for electrically shielding the first and second signal connections, the grounding bar electrically connecting to the guide member;

wherein when the wire member is inserted in the connector member, signals passing over the wire member are communicated from the input end of the connector member to the output end of the connector member, and wherein when the guide member is inserted into a corresponding slot in the connector member, the first and second signal connections are guided to connect with the corresponding electrical receptors.

14. The assembly of claim 13, wherein the wire member is a shielded parallel-pair wire.

15. The assembly of claim 13, wherein the wire member is a twinax wire.

16. The assembly of claim 13, wherein the connector member is capable of receiving multiple wire members.

17. The assembly of claim 13, wherein the output end of the connector member is a printed circuit card.

18. The assembly of claim 13, wherein the first signal connection, the second signal connection, and the drain connection are all electrically isolated from each other.

* * * * *